United States Patent [19]

Molva et al.

[11] Patent Number: 5,349,596
[45] Date of Patent: Sep. 20, 1994

[54] ASYMMETRICAL SEMICONDUCTOR HETEROSTRUCTURE LASER CAVITY AND LASER EQUIPPED WITH SAID CAVITY

[75] Inventors: Engin Molva, Grenoble; Roger Accomo, Le Versoud; Guy Feuillet, St. Martin d'Uriage; Joël Cibert, St. Nazaire les Eymes; Dang Le Si, Montbonnot; Claire Bodin-Deshayes, Grenoble, all of France

[73] Assignee: Commissariat a l'Energie Atomique, Paris, France

[21] Appl. No.: 46,744

[22] Filed: Apr. 16, 1993

[30] Foreign Application Priority Data

Apr. 17, 1992 [FR] France ................ 92 04791

[51] Int. Cl.$^5$ .............. H01S 3/18; H01L 21/203
[52] U.S. Cl. ............................ 372/43; 372/7; 372/44; 372/48; 372/50; 257/12; 257/14; 257/183; 257/191
[58] Field of Search ............ 372/43, 44, 45, 48, 372/49, 50, 108, 109, 69, 70, 7; 257/190, 191, 183, 194, 200, 201, 12, 14

[56] References Cited

U.S. PATENT DOCUMENTS

| 4,745,612 | 5/1988 | Hayakawa et al. ............ 372/45 |
| 5,075,743 | 12/1991 | Behfar-Rad ............ 372/45 X |
| 5,111,255 | 5/1992 | Kiely et al. ............ 372/45 X |
| 5,126,803 | 6/1992 | Hager et al. ............ 372/43 X |
| 5,189,679 | 2/1993 | Derry et al. ............ 372/45 |
| 5,202,897 | 4/1993 | Whitehead ............ 372/43 X |
| 5,208,183 | 5/1993 | Chen et al. ............ 437/129 |
| 5,238,868 | 8/1993 | Elman et al. ............ 372/43 X |
| 5,254,863 | 10/1993 | Battersby ............ 257/191 |

FOREIGN PATENT DOCUMENTS

91401070.7 4/1991 European Pat. Off. .... H01S 3/0959

OTHER PUBLICATIONS

Bogdankevich et al., Variable-gap $Al_xGa_{1-x}As$ heterostructure for an electron-beam-pumped laser, Sov. J. Quantum Electron; vol. 17(9); pp. 1155-1156, Sep. 1987.
Bogdankevich et al., Variable-gap structures in electron-bem-pumped semiconductor lasers, Sov. J. Quantum Electron; l vol. 8(6); pp. 747-751, Jun, 1978.
Bhargava et al., Visible E-Beam Pumped Lasers From II-VI Semiconductors, International Display Research Conference (1985); pp. 200-203.
Cornelissen et al., Blue Solid State Laser Based On Electron-Beam Pumped ZnSe/ZnSSe Double Heterostructures, Philips J. of Research, vol. 46(4/5); pp. 137-155 (1992).
Colak et al., Electron Beam Pumped II-VI Lasers, Journal of Crystal Growth, vol. 72; pp. 504-511 (1985).
Nasibov, Laser cathode ray tubes and their applications, High Power Laser Diodes and Applications SPIE, vol. 893; pp. 200-202 (1988).
Tsang, A graded-index waveguide separate-confinement laser with very low threshold and a narrow Gaussian beam, Appl. Phys. Lett. vol. 39(2); pp. 34-136, Jul., 1981.

Primary Examiner—Brian Healy
Attorney, Agent, or Firm—Burns, Doane, Swecker & Mathis

[57] ABSTRACT

A semiconductor heterostructure laser cavity is disclosed which has semiconductor layers epitaxied to define four zones on a substrate. The laser cavity includes a first zone with a composition that varies continuously from a first face to a second face with a gap decreasing from the first face to the second face, the first zone ensuring an optical confinement and light guidance. A second zone constitutes an active emission zone in contact with the second face of the first zone and having at least one quantum well with a gap smaller than that of the first zone. A third zone has a gap larger than that of the at least one quantum well. The third zone ensuring an optical confinement and a light guidance, and having a composition which varies continuously from a first face to a second face with a gap which increases from the first face to the second face, the first face of the third zone being in contact with the active emission zone. A fourth zone constitutes a buffer zone which contacts the second face of the third zone and a substrate, the fourth zone serving as an optical barrier for light guiding, the first and third zones being asymmetrical with respect to the active emission zone to define an asymmetrical GRINSCH structure, one of the first and third zones constituting a surface of the semiconductor heterostructure for ensuring electron excitation and creation of electron-holes.

20 Claims, 9 Drawing Sheets

ASYMMETRICAL SEMICONDUCTOR HETEROSTRUCTURE LASER CAVITY AND LASER EQUIPPED WITH SAID CAVITY

BACKGROUND OF THE INVENTION

1. Field of the Invention

The present invention relates to a semiconductor heterostructure laser cavity more specifically usable in microlasers. These microlasers can be optically or electronically pumped and can emit in a wide wavelength range from the visible to the infrared. The emission range is a function of the materials used for the heterostructure.

More specifically, the laser cavity is pumped by a source outside the cavity more particularly permitting the emission of a visible laser light of 0.4 to 0.6 $\mu$m and which has numerous applications. Thus, such a laser can be used for the optical reading and recording of information, e.g. on audio and video compact disks, CD-ROM (compact disks—read-only memories), WORM memories (write once-read memories), erasable memories of the magnetooptical or phase change type), in laser printers and in reprography in general.

It can also be used in other applications such as e.g. in bar code readers, laboratory instrumentation, spectroscopy, biomedical instrumentation, pointers, spectacles, projection display, submarine communications, etc.

For the optical reading and recording of information, the laser cavity according to the invention makes it possible to increase the recording density and simplify the optical instrumentation. In laser printers, the cavity according to the invention permits a better definition of the image and an increase in the printing speed compared with known systems and a better adaptation of the wavelengths to photosensitive materials.

2. State of the Art

The different known semiconductor laser types are injection laser diodes which are the only semiconductor lasers at present on the market, lasers having a laser cavity pumped by an external optical source and lasers, whose cavity is externally electronically pumped. Lasers pumped by an external source have advantages compared with laser diodes, particularly as a result of the separation of the functions and the pumping elements and the laser cavity.

Thus, in injection laser diodes, these basic functions (pumping, cavity) are obtained on the semiconductor by appropriate P and N-type electrical doping of the different epitaxied layers and by ohmic electrical contacting.

The different operations involved in the manufacture of these diodes require a perfect control of the heterostructure production technology and are at present only possible with certain semiconductors from the group of III-V compounds (of type GaAlAs). This limits the wavelength range accessible to these laser diodes to between 0.6 and 1.5 $\mu$m.

In external pumping lasers, the injection of the carriers (electrons and holes), which recombine in the active zone of the semiconductor for producing light emission, by definition takes place by a source outside the active semiconductor medium. Consequently it is not necessary to carry out a P or N-type doping of the various epitaxied layers of the laser structure. It is also not necessary for there to be electrical contacts on these layers.

This greatly simplifies the metallurgy of the semiconductor active medium, where consideration only has to be given to the electrical confinement characteristics (electron pumping, quantum wells), optical confinement characteristics (emitted light guidance) and wavelength characteristics.

Thus, it is possible to use in external pumping lasers all direct gap semiconductors and in particular II-VI alloys based on Zn, Cd, Mn, Mg, Hg, S, Se, Te, in which the doping and contact technologies are either not or are only poorly controlled. However, it is not at present known how laser diodes can be made from II-VI material which are equivalent to the known III-V laser diodes. These problems increase as the gap of the materials widens and therefore the emission wavelength shortens. These problems are obviated by the design of external pumping lasers.

The possibility of using all direct gap semiconductors for external pumping lasers makes accessible the wavelength range between the blue and the mid-infrared. In particular, lasers emitting in blue-green make it possible to satisfy existing needs for all applications concerning optical recording. This range is not at present covered by injection laser diodes.

Research is at present taking place for obtaining laser diodes emitting in the blue-green, either on the basis of II-VI semiconductors with the difficulties referred to hereinbefore, or on the basis of III-V laser diodes emitting in the infrared by frequency doubling or similar non-linear effects.

Independently of the pumping mode used, three types of structure are presently used as the active semiconductor medium. These structures can comprise a solid semiconductor material, thin film-type semiconductor materials, or heterostructure-type materials.

The performance characteristics of heterostructure lasers are considerably superior to those of thin film or solid material semiconductor lasers. Heterostructures are widely used in III-V material laser diodes, particularly in the form of a GRINSCH-type structure (graded-index separate-confinement heterostructure) having a graded index optical guide and a separate confinement of the carriers (holes and electrons) and the light.

A GRINSCH-type laser diode structure is described by W. T. Tsang in Appl. Phys. Lett., 39(2), July 1981, "A graded-index waveguide separate-confinement laser with very low threshold and a narrow Gaussian beam", pp 134–136. This known laser diode structure has an active zone constituted by a quantum well located in the centre of a symmetrical composition gradient structure. This quantum well is a thin layer of a semiconductor material with a forbidden band or energy gap below that of the adjacent materials. This composition gradient induces a gap gradient and optical index. The gap gradient improves the collection efficiency of the carriers supplied by the injection current. The index gradient makes it possible to centre the guided optical mode on the active zone. This leads to a good "electron confinement", a good "optical confinement" and an optimum superimposing of the gain zone (quantum well) and the guided optical mode.

The GRINSCH structure makes it possible to obtain a very small laser threshold and it is the "conventional" structure presently used in III-V laser diodes.

Unfortunately, this conventional structure cannot be pumped by an external source because the active zone is much too far from the surface of the structure. The distance separating the active zone from the surface is >1 $\mu$m and typically 2 to 3 $\mu$m. In addition, the use of N and P doping only makes it possible with considerable difficulty to produce GRINSCH-type laser diode structures from II-VI materials.

A compact heterostructure laser of the GRINSCH type and with external electronic pumping is in particular described in FR-A-2 661 566 filed in the name of the present Applicant. This laser has as the external pumping source an electron gun with a microdot electron source. Such a semiconductor microdot laser or SML has all the advantages of external pumping and the use of a heterostructure referred to hereinbefore. However, this SML requires, in the absence of an adapted, optimized heterostructure, a high operating current in order to reach the laser threshold current density, as well as a high accelerating voltage pumping. Its energy costs can be relatively high, so that it is difficult to produce a compact system with a long life.

SUMMARY OF THE INVENTION

The present invention relates to a novel semiconductor heterostructure for a laser cavity making it possible to obviate these disadvantages. This heterostructure makes it possible to improve the performance characteristics of a laser equipped with said heterostructure and more specifically that of a SML-type laser.

More specifically, the invention relates to a semiconductor heterostructure laser cavity having semiconductor layers epitaxied on a substrate, essentially defining four zones:

a first zone whose composition varies continuously from a first face to a second face with a gap decreasing from the first to the second face, said first zone ensuring an optical confinement and light guidance, a second zone constituting an active emission zone in contact with the second face of the first zone, having at least one quantum well with a gap smaller than that of the first zone, a third zone having a gap larger than that of the quantum well or wells, said third zone ensuring an optical confinement and a light guidance and its composition varies continuously from a first to a second face with a gap which increases from the first to the second face, the first face of the third zone being in contact with the active zone, a fourth zone constituting a buffer zone in contact with the second face of the third zone and the substrate, said fourth zone serving as an optical barrier for light guiding, the first and third zones being asymmetrical with respect to the active zone and defining with the latter an asymmetrical GRINSCH structure, one of the first and third zones also ensuring an electron excitation and the creation of electron-hole pairs and thus constituting one of the surfaces of the semiconductor heterostructure.

The increase and decrease of the gap can be linear, quasi-linear or parabolic.

This laser cavity leads to an improvement and a simplification of GRINSCH-type heterostructure laser cavities, more particularly making it possible to lower the operating threshold of an external pumping laser using said cavity.

The invention also relates to a laser having the cavity defined hereinbefore and external pumping means. These pumping means can be of the optical or electronic type.

Optical pumping can be provided by a lamp, a laser or a laser diode, associated with exciting light focusing optics. The wavelength of the exciting laser must be below that of the heterostructure laser cavity, whereas its energy must be higher.

Electronic pumping can be provided by a conventional electron gun like that described in "Electron beam, pumped II-VI lasers" by S. Colak, L. J. Fitzpatrick and R. N. Bargava, J. of Crystal Growth, vol. 72, pp 504 (85) and "Laser cathode ray tubes and their applications", by A. Nasibon, SPIE, vol. 893, High power laser diodes and applications (88), p 200, or by an electron gun having an electron source formed by an array or matrix of emissive microdot cathodes with cold electron emission by field effect. Such a source is described in FR-A-2 661 566. An adapted electron optics permits the focusing of the electron beam in ribbon form.

The essential function of the heterostructure is to guarantee a low threshold laser operation ($<10$–$20$ kW/cm$^2$) between 77 and 300K, as well as a low electron accelerating voltage ($<10$ kV) in the case of electronic pumping. This is obtained by optimizing the heterostructure and coupling between the functions fulfilled by it. In the case of ribbon focusing, it is necessary to have a low optical or electronic pumping power operation (a few Watts).

The four separate zones of the heterostructure fulfil three different functions, namely the confinement of carriers and gain, confinement of photons and collection of carriers.

The active light emission zone fulfils the electron carrier confinement and light gain function (holes and electrons). It is constituted by one or more quantum wells and optionally a superlattice or pseudoalloy formed by an alternation of quantum wells and barriers.

It is pointed out that a quantum barrier is a thin semiconductor material layer having a gap greater than that of the adjacent materials and that a quantum well is a thin semiconductor material layer having a gap smaller that that of the adjacent materials.

The composition and thickness of the quantum wells determine the laser emission wavelength. The spectral width of the gain curve is directly dependent on the growth or increase conditions of these wells and can be improved by heat treatment (or annealing) following epitaxial growth, at temperatures below 400° C. in the case of II-VI compounds and in particular between 150° and 400° C. This heat treatment ensures an interdiffusion of the semiconductor layers.

The first zone with decreasing gap gradient and increasing reflection index from the first to the second face, in principle forms the excitation zone of the laser cavity, the generation zone for the electron-hole pairs and the zone of accelerated diffusion of carriers to the active zone. Thus, this first zone fulfils the function of collecting the carriers created by the pumping beam.

For optical pumping, the exciting beam is absorbed on a few hundred nanometers. The depth is dependent on the absorption coefficient of the semiconductor material interacting with the pumping beam, said coefficient varying with the wavelength of the exciting beam and the gap of the semiconductor.

For electronic pumping, the electron-hole pairs are created over a depth $Rp \pm dRp$, in which $Rp$ is the average penetration depth of the exciting electrons and $dRp$ the extension of said average depth. $Rp$ and $dRp$ are of the same order of magnitude (a few hundred nanometers for exciting electron accelerating voltages below 10 kV) and increase with the energy of the incident electrons. The electro-hole pairs created are attracted by the active emission zone, as a result of the gap gradient of the first zone.

The first zone ensures part of the confinement of the photons and light guidance in the active zone. This photon confinement is due to the use of materials having a refraction index higher than that of the vacuum on the one hand and that of the fourth zone on the other and varies within the zones 1 and 3 in the manner defined hereinbefore.

The second part of the optical confinement and light guidance is ensured by the third zone, whose refraction index is also higher than that of vacuum on the one hand and that of the fourth zone on the other and varies within zones 1 and 3 in the manner described hereinbefore.

In certain embodiments, said third zone can also be used for creating and collecting carriers. In this case, the first zone only fulfils an optical confinement function. Advantageously the third zone has a thickness less than that of the first zone, which causes the asymmetry of the laser cavity.

In order to bring about pumping by an external source, it is necessary for the GRINSCH structure to be close to the surface of the heterostructure exposed to the exciting beam. For this purpose the first and third zones have a thickness of at the most 1 $\mu$m.

The asymmetry, whilst ensuring a good optical and electronic confinement, also ensures a centring of the guided optical mode on the emission zone, so as to obtain maximum coupling between the emitted photons and the guided mode. Conversely, in a symmetrical GRINSCH structure close to the surface (with a thin surface layer for external pumping), said coupling is not of an optimum nature. This leads to a drop in the laser efficiency and laser operation under a high current.

The asymmetry also ensures electronic pumping with low accelerating voltages. Asymmetry also ensures an optimization of the collection and confinement of the carriers created close to the surface of the cavity in the active zone. The asymmetry results from the different thicknesses of the first and third zones, as well as the slope respectively of the decrease and the increase of the gap of the first and third zones, which differ.

As it also serves as a light barrier, the fourth zone must have a refraction index equal to or below the minimum index of the third zone. This buffer zone ensures a step index adequate for ensuring the confinement of the photons in the active zone, ensures an adaption of the crystal lattice parameter between the substrate and the third confinement zone, improves the quality of the semiconductor material (structural quality and impurities) and moves the substrate away from the confinement zone and therefore the guided modes.

This buffer zone can be formed from a single material or from several layers having different compositions, or can include a superlattice or pseudoalloy. Advantageously, the buffer zone has a buffer layer essentially serving as an optical barrier and as an adapting layer.

The heterostructure according to the invention can be produced from materials which do nor do not have significant lattice unbalances or asymmetries. In the case where such asymmetries exist, it is generally preferable to keep the complete heterostructure in coherent stress, i.e. with thicknesses below the critical thickness in the active part of the structure constituted by the first, second and third zones, whereas the fourth zone (buffer layer) can be relaxed with respect to the substrate.

Thus, below the critical thickness, the lattice unbalance or asymmetry between two materials is accommodated by an elastic deformation, whereas above the critical thickness, defects (e.g. dislocations, stacking faults, twins, etc.) are created. These defects or faults can lead to a deterioration of the performance characteristics and can reduce the laser cavity life.

Still in the case of a stressed structure and for certain materials (e.g. II-VI and III-V compounds), the valence band is broken down into a so-called heavy hole band and a so-called light hole band. The radiative recombination between the electrons and the heavy holes is more effective than between the electrons and the light holes. A stressed heterostructure can therefore favour the population or occupancy of the band with heavy holes.

The materials to which the invention applies are all direct gap semiconductors and in particular III-V semiconductors (Ga, Al, In-As, P, N, Sb), II-VI semiconductors (Cd, Zn, Hg, Mn, Mg-Te, S, Se) and IV-VI semiconductors (Pb, Sn-Te, Se), etc.

For example, the heterostructure according to the invention is made from at least one of the semiconductor materials chosen from among: $Cd_{1-x}Mn_xTe$, $Cd_xHg_{1-x}Te$, $Cd_xZn_{1-x}Te$, $Cd_xZn_zMn_{1-x-z}Te$, $Cd_xZn_{1-x}Se$, $CdS_ySe_{1-y}$, $Cd_xZn_{1-x}S_ySe_{1-y}$, $Zn_zMn_{1-z}Se$, $Zn_zMg_{1-z}S_ySe_{1-y}$, $Ga_xAl_{1-x}As$, $Ga_xAl_{1-x}N$, with $0 \leq x \leq 1$, $0 \leq y \leq 1$, $0 \leq z \leq 1$ and $0 \leq x+z \leq 1$.

II-VI semiconductors permit a large emission wavelength adjustment range. In particular, cavities including CdHgTe can emit in the infrared and those including CdMnTe, ZnSe, ZnS, etc. can emit visible light up to the blue-ultraviolet.

In order to ensure the temperature control of the laser cavity, the latter is advantageously fitted on a thermal mass.

Advantageously, the laser cavity is fitted or mounted on said thermal mass in such a way that the epitaxied layers rest thereon. In this case, the substrate constitutes the upper part of the laser cavity and the third zone then fulfils the function of creating and collecting the carriers. In order to ensure the external pumping on said third zone, there must be a local freeing of the substrate and the buffer zone.

The asymmetrical composition gradient, quantum well laser cavity according to the invention optimizes the coupling between the optical or electronic pumping beam, the guided optical mode and the gain zone in order to improve the functions of said heterostructure.

The laser cavity according to the invention can be of the Fabry-Perot or distributed type. In this case, it has two cleaved, parallel side faces oriented perpendicular to the semiconductor layers. Semireflecting mirrors can optionally be deposited on these side faces. These semireflecting mirrors are in particular constituted by multilayer dielectric material deposits.

The laser cavity can also be guided by the light gain or index. In this case, it can have a mesa structure defining a ribbon, can be epitaxied in several stages with an alternation of etching and have implanted, interdiffused or laterally diffused regions.

An original variant associated with ribbon pumping (by optical or electron focusing) consists of obtaining a lateral confinement by a metal deposit (Ag, Au, Al or other appropriate metal) on the surface to be excited, whilst leaving an exciting ribbon free.

This metal deposit fulfils three functions:

a) local reduction, below the metal deposit, of the effective index of the guide, leading to a confinement of the guided modes at the exciting ribbon, as in the case of index-guided structures in injection laser diodes, b) removing the heat produced by the external pumping to the thermal mass, in order to control the cavity temperature, c) stopping electrons (electron pumping) or photons (optical pumping) arriving outside the width of the focusing ribbon.

This metal deposit can optionally be associated with a mesa-type structure or an index-guidance structure.

The production of index-guided structures is known, cf. e.g. the article "Laser diode modulation and noise" by K. Peterman, pp 36/37, ADOP Advances in Optoelectronics KTK Scientific Publishers).

Moreover, the use of a metal deposit for the lateral confinement of guided modes is known for applications other than lasers, cf. e.g. the article "Guided-wave optoelectronics" by T. Tamin, pp 326/7, Springer Series in Electronics and Photonics, 26).

By using as the pumping means a microdot source electron gun, it is possible to obtain a microlaser with a volume of a few $cm^3$.

The laser cavity according to the invention can be produced with means and processes already used in microelectronics for producing semiconductor lasers.

BRIEF DESCRIPTION OF THE DRAWINGS

The invention is described in greater detail hereinafter relative to non-limitative embodiments and with reference to the attached drawings, wherein show:

FIGS. 8A to 8E Variants for fixing the cavity according to the invention to a thermal mass.

DETAILED DESCRIPTION OF THE PREFERRED EMBODIMENTS

Figure 1A:
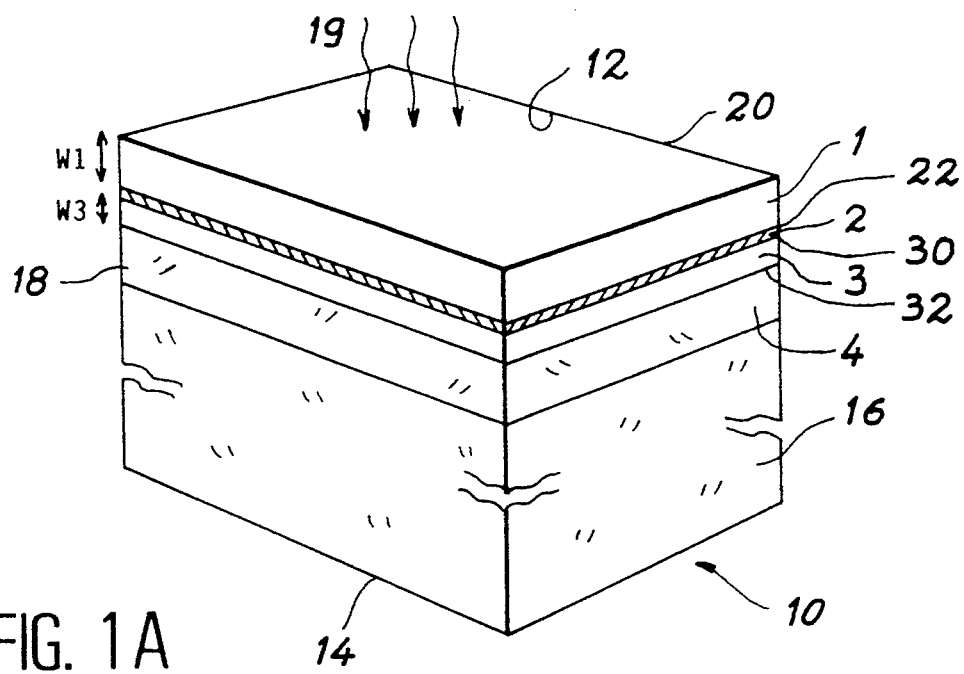
FIG. 1A Diagrammatically and in perspective view a Fabry-Perot laser cavity according to the invention.

FIG. 1A diagrammatically shows a distributed or Fabry-Perot laser cavity according to the invention. This laser cavity 10 comprises, starting from its upper surface 12, towards its lower surface 14, semiconductor zones 1, 2, 3 and 4 epitaxied on a semiconductor substrate 16.

These zones are epitaxied in known manner, either by molecular beam epitaxy (MBE), or by metalorganic chemical vapour deposition (MOCVD) epitaxy, or by any other similar known procedure. These zones are made from semiconductor materials of type II-VI, III-V or IV-VI with a direct gap.

The laser cavity 10 is in the form of a parallelepipedic bar, whose two sides faces 18, 20, which are parallel to one another and perpendicular to the epitaxied zones, are obtained by cleaving the zone-substrate assembly and constitute semireflecting mirrors for the entrance and exit of the laser cavity. The other side faces are not active.

In exemplified manner, said laser cavity has a thickness-reduced substrate 16 of 50 to 300 $\mu m$. The width of the laser cavity separating the non-active faces is obtained by cutting the zone-substrate assembly with a diamond saw and to a typical thickness of 1 mm. The length of the Fabry-Perot cavity, i.e. the distance separating the cleaved faces 18, 20 varies between 100 and 1000 $\mu m$. The typical value is 500 $\mu m$.

The reflectivities of the cleaved mirrors are determined by the optical index of the semiconductor and is generally approximately 30% for II-VI or III-V semiconductors. This reflectivity could optionally be improved by depositing dielectric and metallic multilayers on the cleaved faces. This deposit also protects the active faces.

The laser cavity according to the invention is optimized for an excitation or pumping by an external source of the optical or electronic pumping type. This pumping is symbolized by the particle beam 19 interacting with the laser structure in a direction perpendicular to the epitaxied zones.

According to the invention, the surface zone 1 constitutes both the excitation zone of the structure, the generation zone for the electron-hole pairs due to the exciting beam-semiconductor material interaction of the zone 1 and the accelerated diffusion zone of the carriers created in said zone towards the active zone 2. The zone 1 also fulfils the first part of the optical confinement of the light emitted in the active zone.

Zone 2 constitutes the light emission active zone, as well as the electronic confinement zone for the carriers. This active zone 2 is contiguous and adjacent to the optical confinement and excitation zone 1.

Zone 3, which is contiguous and adjacent to the active zone 2, constitutes the second part of the optical confinement zone.

Zone 4, placed between the confinement zone 3 and the substrate 16, constitutes the buffer zone and serves as an optical barrier.

Figure 1B:
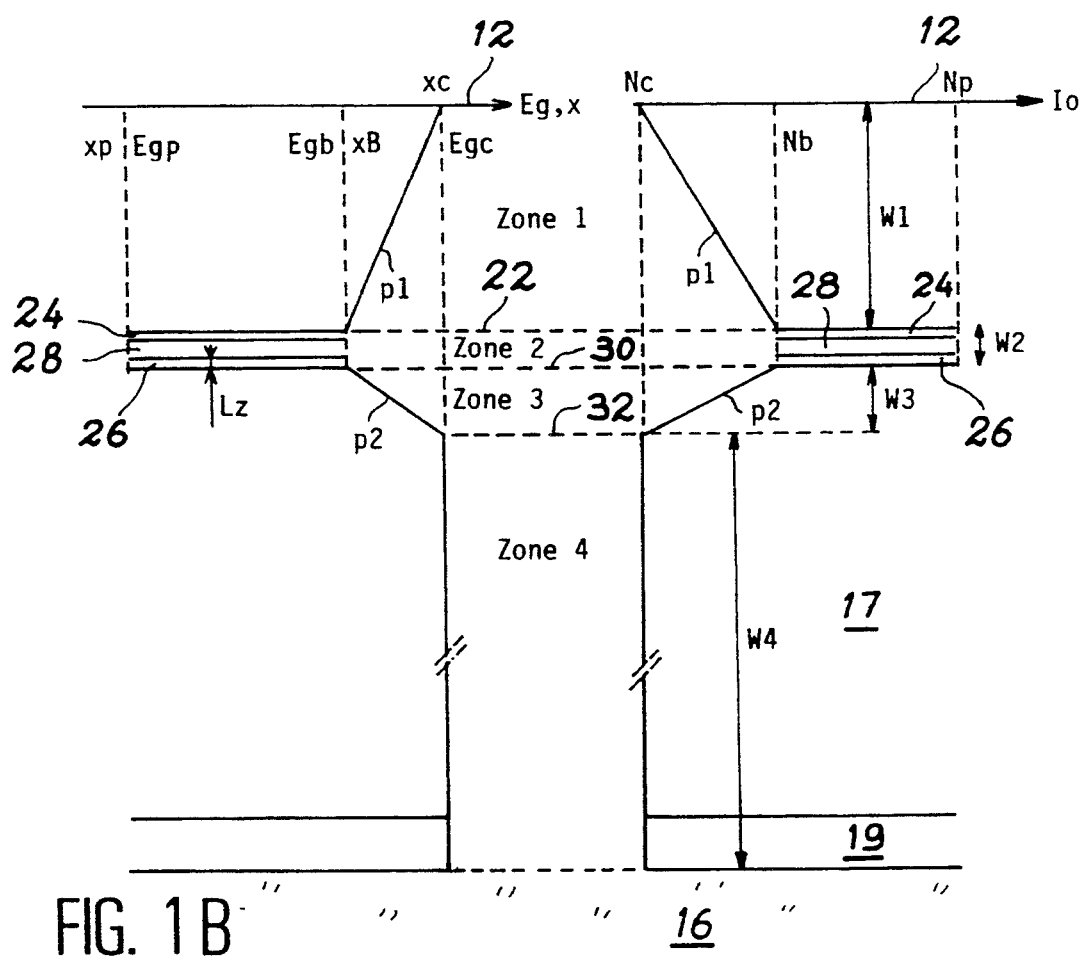
FIG. 1B The evolution of the composition (x), of the gap energy ($E_g$) and the optical index ($I_o$) of the heterostructure of the cavity of FIG. 1A.

According to the invention and with reference to FIG. 1B, zone 1 is made from a semiconductor material, whose composition x varies continuously from the upper surface 12 to the interface 22 of the zones 1 and 2. This variation is linear or quasi-linear. $x_c$ is used to designate the composition of the zone 1 at the surface 12 and $x_b$ to designate its composition at the interface 22.

The variation of the composition of zone 1 can be obtained in known manner either by modifying the temperature of the effusion cell which produces the atomic or molecular beam in the case of MBE, or by successive modifications of the composition of the atomic beam.

This composition is such that the gap energy $E_g$ decreases linearly or quasi-linearly from the surface 12 to the interface 22 and that conversely the optical refraction index $I_o$ increases linearly or quasi-linearly from the surface 12 to the interface 22.

$E_{gc}$ and $N_c$ are used to respectively designate the gap energy and the refraction index of zone 1 having the composition $x_c$ and $E_{gb}$ and $N_b$ respectively designate the gap energy and the refraction index of zone 2 having the composition $x_b$.

According to the invention, the active zone 2 is constituted by one or more quantum wells, e.g. of the superlattice type, for the purpose of confining the carriers. FIG. 1B only shows two quantum wells 24, 26 separated by a quantum barrier 28. The quantum wells 24, 26 are made from a semiconductor material having a gap energy $E_{gp}$ below that of the zone 1 at interface 22.

The optical index $N_p$ of these wells can be of a random nature and can e.g. exceed that of the zone 1 at the interface 22. Thus, the quantum wells which are very thin are only very slightly involved in the optical confinement and light guidance, guidance being ensured by zones 1 and 3.

The quantum barrier 28 must have a gap energy above that of the quantum wells 24, 26 and can be equal to or different from that of the zone 1. In practice, the gap energy of the barrier layer 28 is equal to that of the zone 1 at the interface 22 of zones 1 and 2. This can be obtained by using the same material as that of zone 1 with the composition $x_b$.

According to the invention, zone 3 has a semiconductor composition varying continuously from its upper surface 30 or interface between the zones 2 and 3 to its lower surface 32 or interface between zones 3 and 4. This composition is such that the gap energy of zone 3 increases linearly or quasi-linearly from the interface 30 to the interface 32 and conversely the optical index decreases linearly or quasi-linearly from the interface 30 to the interface 32.

Zone 3 can be made from a semiconductor material different from that of zone 1. In the represented example, the same composition $x_c$ is used at the surface 12 and at the interface 32 and the same composition $x_b$ at the interfaces 22 and 30.

Zone 4 can have a constant composition up to the substrate, which can be identical to or different from that of the zone 3. It must have a composition such that its refraction index is at the most equal to the index $N_c$ of zone 3 at the interface 32. It can also be constituted by two separate layers, namely an optical confinement layer 17 and an adaptation layer 19 between the layer 17 and the substrate.

According to the invention, the thickness $W_1$ of the zone 1 and the thickness $W_3$ of the zone 3 are different and in particular $W_1$ exceeds $W_3$. Moreover, the gap energy decrease slope $p_1$ of zone 1 and conversely the optical index increase slope of zone 1 differs from the gap energy increase slope $p_2$ of zone 3 and conversely the optical index decrease slope of zone 3.

The laser structure according to the invention is consequently a GRINSCH structure with quantum wells and gap and index gradients. It is also asymmetrical with respect to the active zone and more specifically with respect to the quantum barrier 28 in the case shown in FIG. 1B.

This asymmetrical structure is particularly adapted for electronic external pumping with low electron accelerating voltages or for optical external pumping whilst having a good optical and electronic confinement. The asymmetry ensures an optimization of the structure so as to centre the guided optical mode on the active emission zone for obtaining maximum coupling between the photons emitted in the zone 2 and the guided mode. The composition variations of zones 1 and 3, the thicknesses $W_1$ and $W_3$ of zones 1 and 3, as well as the thickness $W_2$ of the active zone and the thickness $W_4$ of the buffer zone 4 are dependent on the lattice parameter differences between the different semiconductor materials, the chosen emission wavelength and the chosen group of compounds.

The laser cavity according to the invention can be made from materials which do or do not have significant lattice asymmetries or unbalances. When these exist, preferably semiconductor material thicknesses below the critical thickness are used in zones 1, 2 and 3 of the structure, whereas zone 4 can be relaxed with respect to the substrate.

As a result of the external pumping of the laser cavity according to the invention, the doping of the semiconductor zones can be of a random nature. In particular, the semiconductor layers may be non-intentionally doped. Thus, the laser cavity according to the invention can be advantageously made from II-VI material. These materials permit a wide laser emission wavelength adjustment range. In particular, the materials including CdHgTe can emit in the infrared and those including CdMnTe, ZnSe, ZnS, CdZnSe or ZnSSe can emit from the visible to the blue-ultraviolet.

In particular, the cavity according to the invention can be of $Cd_{1-x}Mn_xTe$ with $0 \leq x \leq 1$. In this case, the higher the manganese composition x, the more the gap energy $E_g$ increases and the more the optical index decreases. Thus, in a particular embodiment, the quantum wells can be made from CdTe.

For a $Cd_{1-x}Mn_xTe$ heterostructure, it is possible to use a 100 nm to 1 μm zone 1, one or more small quantum wells each having a width $L_z$ from 0.1 to 100 nm, as well as a zone 3 with a thickness W from 100 nm to 1 μm, provided that $W_1 > W_3$.

If $x_c$ is the manganese composition of zone 1 at surface 12 and that of zone 3 at interface 32, $x_b$ the manganese composition at interfaces 22 and 30 respectively between zones 1 and 2 and zones 2 and 3, as well as that of the barrier layer 28 and $x_p$ the manganese composition of the quantum wells, $x_c$, $x_b$ and $x_p$ can vary from 0 to 1 with $x_b - x_p \geq 0.10$ and $x_c - x_b \leq 0.10$, in order to ensure a step index adequate for the optical confinement of the light emitted, as well as a capture of the carriers.

The laser cavity can also be made from $Cd_xHg_{1-x}Te$ with $0 \leq x \leq 1$. Here again, the more x increases, the more the gap energy $E_g$ increases and the optical index decreases.

It is also possible to use quaternary alloys of type $Cd_xZn_zMn_{1-x-z}Te$ with $0 \leq x \leq 1$, $0 \leq z \leq 1$ and $0 \leq x+z < 1$. Published results demonstrate that an emission into the blue can be observed for CdTe quantum wells separated by MnTe barriers or ZnTe quantum wells separated by MnTe barriers.

Figure 2A:
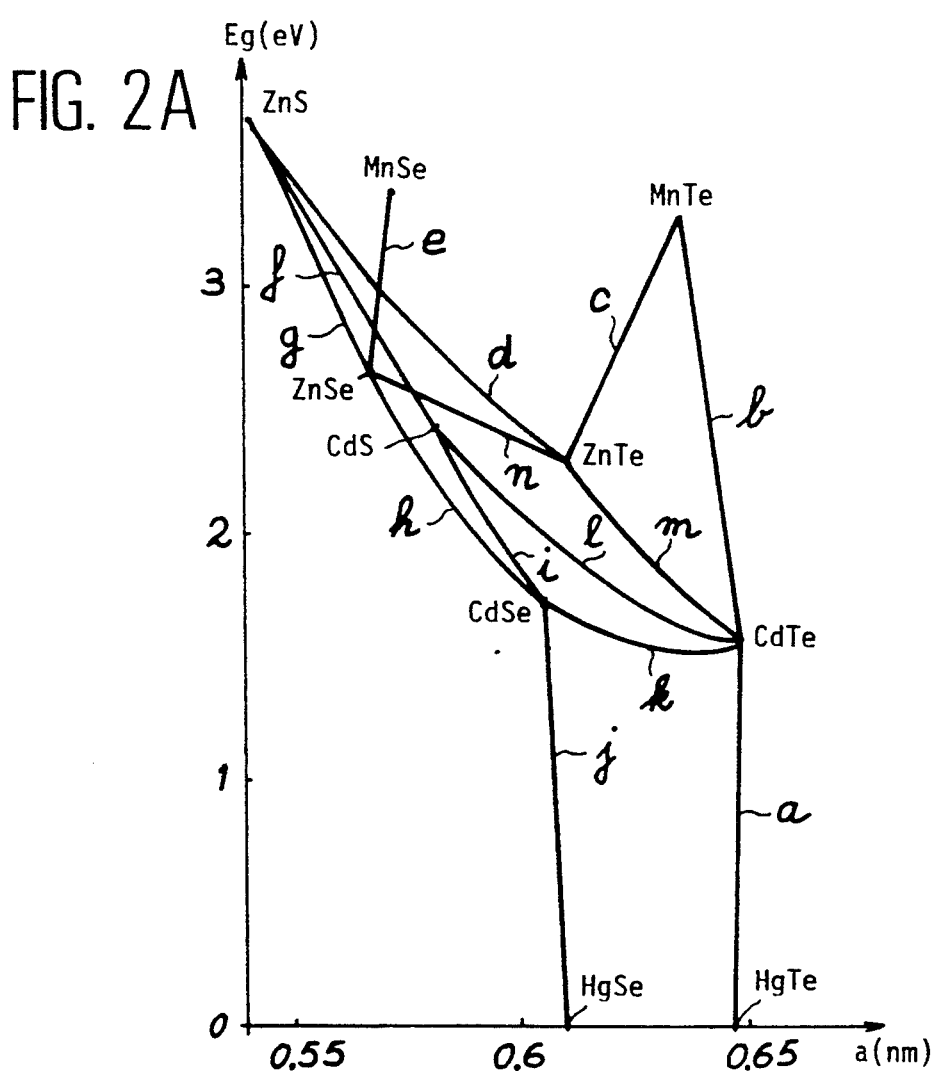
FIG. 2A The evolution of the gap ($E_g$) in electron-volts and that of the lattice parameter a in nanometers for II-VI compounds usable in the cavity according to the invention.

FIG. 2A shows the gap energy variations $E_g$ expressed in electron-volts and lattice parameter a in nm for different II-VI compounds. The graph of FIG. 2 shows the binary compounds. The lines linking two binary compounds are representative of intermediate compounds between them.

For example, line a corresponds to CdHgTe compounds, line b to CdMnTe compounds, line c to ZnMnTe compounds, line d to ZnTeS compounds, line e to MnZnSe compounds, line f to ZnCdS compounds, line g to ZnSSe compounds, line h to ZnCdSe compounds, line l to CdSSe compounds, line j to HgCdSe compounds, line k to CdSeTe compounds, line l to CdSTe compounds, line m to ZnCdTe compounds and line n to ZnSeTe compounds.

All these compounds can be used for producing the cavity according to the invention respecting the gap energy conditions (cf. FIG. 1B) for the quantum barriers and wells.

Figure 2B:
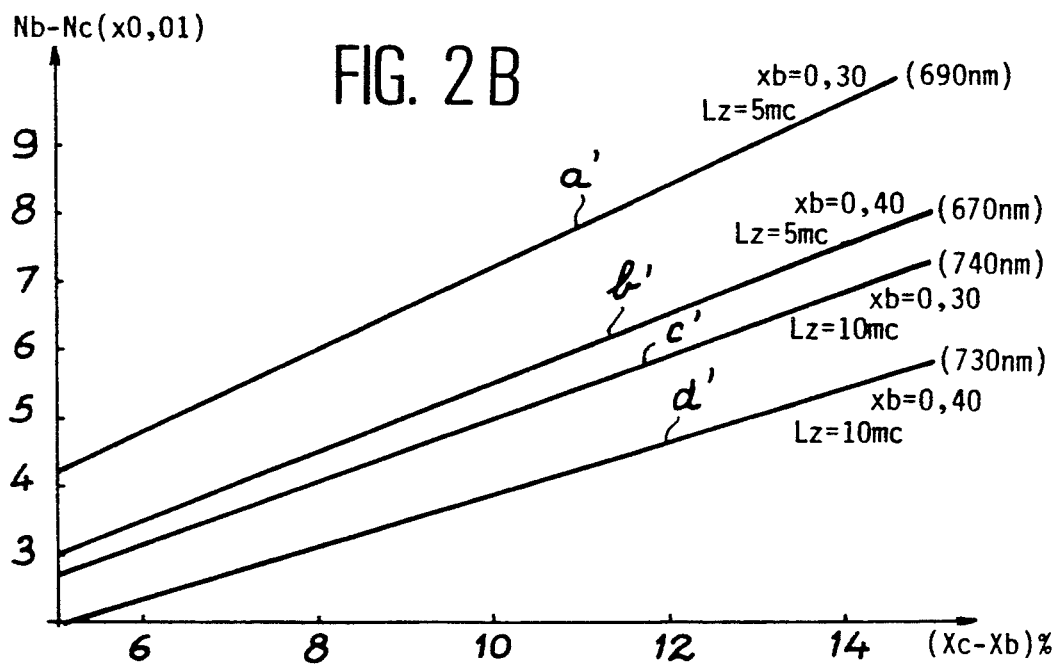
FIG. 2B Variations of the optical index for the optical confinement in a CdTe/CdMnTe heterostructure.

FIG. 2B shows variations of the optical index for the optical confinement in the case of a CdMnTe heterostructure with quantum wells in the active CdTe zone. More specifically, FIG. 2B gives the variations $N_b - N_c$ as a function of the composition difference $x_c - x_b$. The lines a', b', c' and d' respectively correspond to a composition $x_b$ of 0.30, 0.40, 0.30, 0.40 and a width $L_z$ of quantum wells of respectively 5, 5, 10 and 10 monolayers. In the present case, a monolayer with a thickness of approximately 0.32 nm represents the deposition of a layer of cadmium atoms and a layer of tellurium atoms, whilst $x_c$ equal $\leq 1$.

For each curve, the emission wavelength differs, which induces different index variations. These wavelengths are given in FIG. 2B. Thus, the optical index increases linearly when the Mn composition x decreases linearly.

The thickness limitation of the quantum well or wells is given by the critical thickness and are well known. For the pair CdTe/ZnTe, the well is limited to a thickness of 1.7 nm and for the pair $CdTe/Cd_{0.96}Zn_{0.04}Te$ to a few hundred nm (e.g. 300 nm).

By using materials having smaller lattice asymmetries, such as e.g. the CdTe/CdMnTe structure, the critical thickness is increased, which makes it possible either to increase the thickness of the quantum well, or the number of wells. This also makes it possible to obtain a better optical confinement either by increasing the thicknesses of zones 1 and 3, or by accentuating the composition variation $x_c - x_b$.

No matter what the thickness of the well, the light gain therein remains high as a result of the confinement of the carriers in said well. Thus, the quantum well can be reduced to a few atomic layers.

The emission wavelength is dependent on the composition of the quantum wells, but particularly on their width. Thus, small fluctuations in the thickness of the well, at the atomic monolayer scale, play a fundamental part in the spectral widening of the gain curve. If the gain curve width is excessive, the maximum gain in the centre of the curve can become too small.

A good control of the morphology of the interfaces between the two materials forming the quantum well is consequently important. This is ensured by the epitaxial growth conditions. In certain cases, a subsequent heat treatment can be used for reducing the spectral dispersion of the state density, which defines the spectral width of the emission line and therefore the gain curve. For example, it is possible to use a heat treatment at 150° to 400° C. for 1 to 60 minutes. This can take place in an over or furnace following the epitaxy of the different layers of the structure or following the fitting of the laser cavity in the laser during the stoving and degassing phase of the assembly under electron bombardment.

Figure 3A:
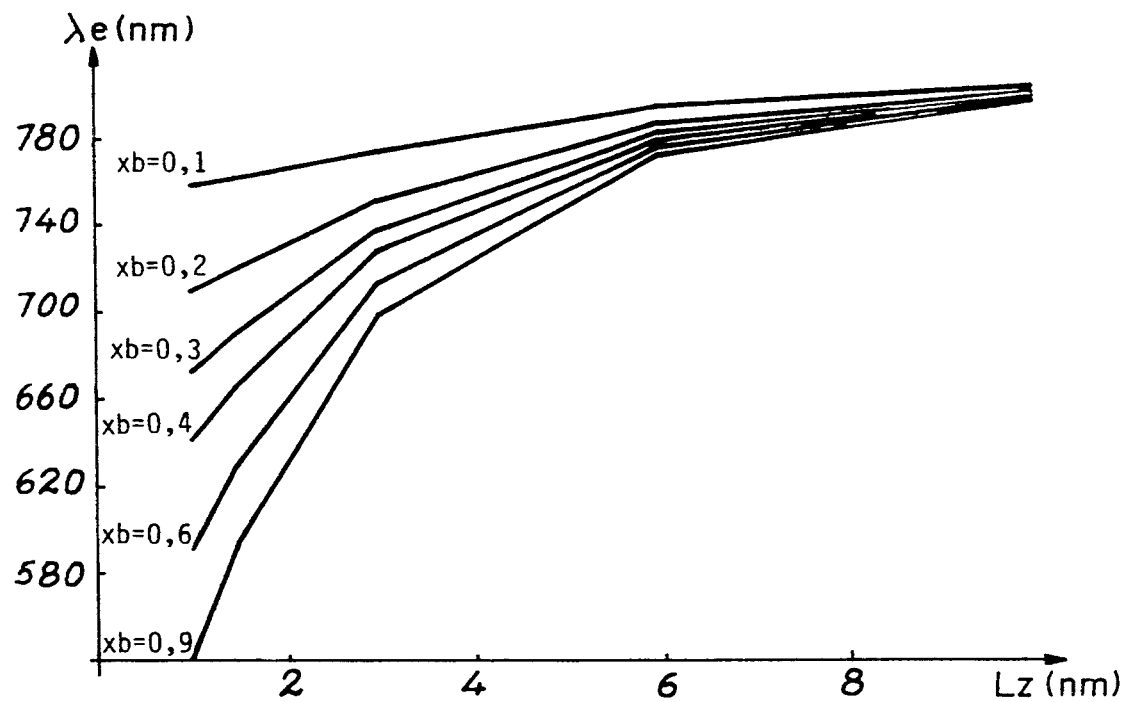
FIGS. 3A and 3B The emission wavelength ($\lambda e$) in nanometers as a function of the composition of the active zone for a heterostructure according to the invention of CdTe/CdMnTe respectively at 300K and 77K.
Figure 3B:
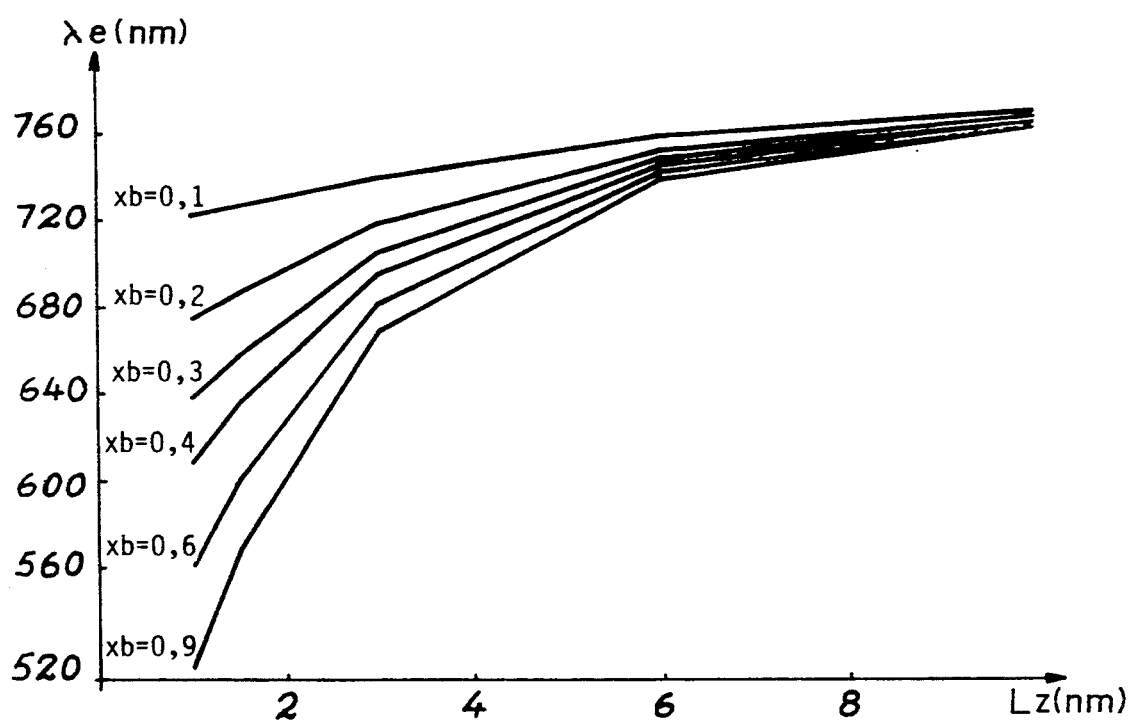

FIGS. 3A and 3B show the variations of the emission wavelength $\lambda e$ in nanometers for a CdTe/CdMnTe heterostructure at respectively 300 and 77K for different well widths and different compositions of the barrier 28 between the wells. This composition of the barrier 28 is also the composition $x_b$ of zones 1 and 3 respectively at the interfaces 22 and 30 with the active zone. The wells are here of CdTe and the upper surface 12 of the zone 1 and the interface 32 between the zones 3 and 4 are respectively of $Cd_{1-xc}Mn_{xc}Te$ with $X_c - x_b \geq 0.05$.

FIGS. 3A and 3B are given for a single quantum well of width $L_z$ for the active zone. For example, for $x_b = 0.9$, one obtains an emission from 540 to 775 nm at 300K for a quantum well width between 1 and 6 nm. With $x_b = 0.2$, at 77K there is an emission from 675 to 755 nm for a quantum well width between 1 and 6 nm.

On the basis of these curves, it can be seen that the emission wavelength increases with the width of the quantum well also decreases with the value of $x_b$. It is possible to further shorten the emission wavelength by using CdMnTe instead of CdTe quantum wells.

Specific examples of the construction of a laser cavity according to the invention will now be given using a $CdTe/Cd_{1-x}Mn_xTe$ heterostructure.

EXAMPLE I

Zone 1 has a thickness of 500 nm and a Mn composition varying continuously from the surface 12 to the interface 22 between zones 1 and 2 of 0.22 to 0.17. The active zone 2 is constituted by two CdTe wells of 6 nm each, separated by a 15 nm CdMnTe barrier with an Mn composition of 0.17. Zone 3 has a thickness of 150 nm and a Mn composition varying from the interface 30 between zones 2 and 3 to the interface 32 between zones 3 and 4 from 0.17 to 0.22. The buffer layer 4 is a 1.5 μm CdMnTe layer with a Mn composition x of 0.22. The substrate is of CdTe of orientation 100.

EXAMPLE II

Example II differs from example I by the use of a lattice adapting layer 19 between the buffer layer and the substrate. This adapting layer is a superlattice constituted by 5 CdTe, wells, each having a thickness of 6 nm, alternating with 4 15 nm CdMnTe barriers with a Mn composition of 0.22.

Figure 4:
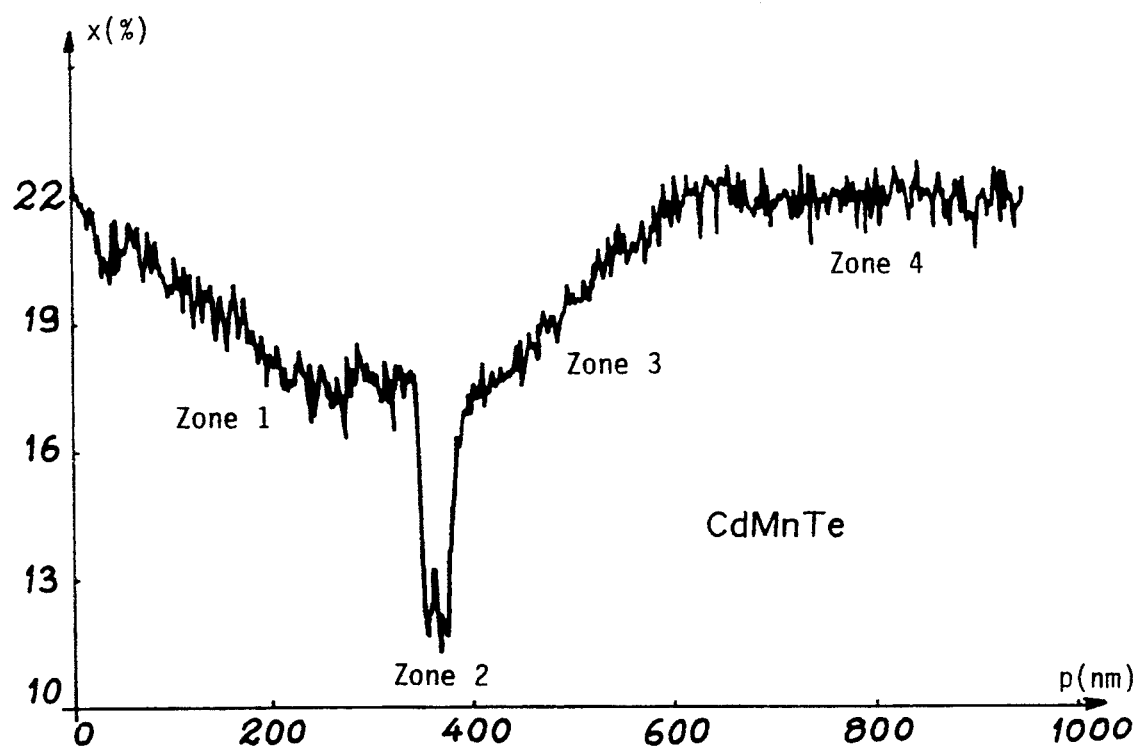
FIG. 4 The variations of the manganese composition (x %) as a function of the depth (p) in nanometers or a $Cd_{1-x} Mn_x Te$ heterostructure, measured by SIMS spectroscopy.

This structure was controlled by SIMS spectroscopy, as shown in FIG. 4. It gives the variations of the manganese composition x as a function of the depth p in nm. These measurements are only given for information purposes, in view of the calibration and resolution problems inherent in this analysis type.

The laser cavity according to the invention can be electronically pumped with an electron beam. The latter produces electron-hole pairs at an average depth $R_p$ increasing with the electron accelerating voltage and which is dependent on the semiconductor materials of the laser cavity. These pairs are created over a depth $d_{Rp}$ around $R_p$.

For a maximum electronic pumping efficiency, $R_p$ and $d_{Rp}$ must be matched to the heterostructure dimensions. Thus, the electron-hole pair creation profile must have its maximum in heterostructure zone 1, as can be clearly gathered from FIG. 5.

Figure 5:
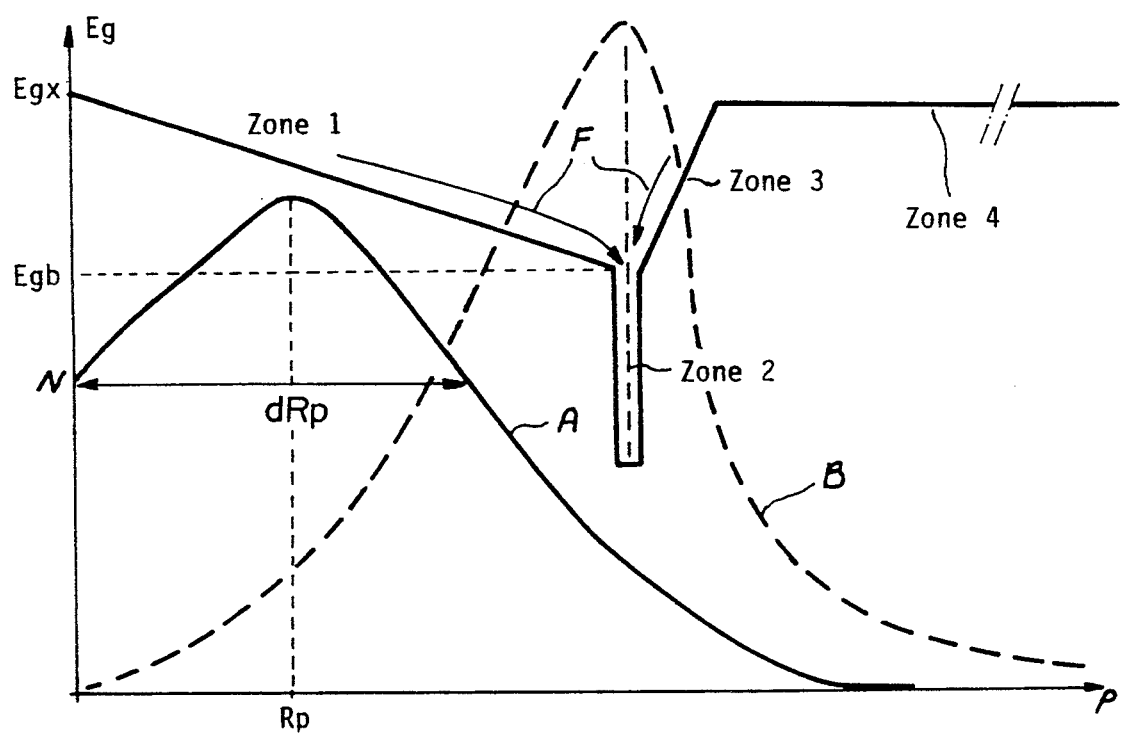
FIG. 5 The creation profile of electron-hole pairs in a cavity according to the invention electronically pumped by an electron beam.

Curve A is the electron-hole pair creation profile and gives the variations of the number N of electron-hole pairs as a function of the heterostructure depth p. FIG. 5 also shows the variations of the gap energy $E_g$ of the heterostructure as a function of the depth p. The capture of these electron-hole pairs takes place at the heterostructure zones 1 and 3, as indicated by the arrows F.

By using, in accordance with the invention, a heterostructure having a limited thickness (below 5 μm), it is possible to use low electron accelerating voltages (below 20 kV), which leads to an easier, more compact and more reliable fitting of the laser. Typically, use is made of a 10 kV electron beam. For II-VI compounds, such a beam has an average penetration depth of 250 nm and an extension $d_{RP}$ of approximately 400 nm.

The function of the passage of the carriers to the quantum wells of the active zone is particularly important for narrow wells and therefore for structures emitting at low wavelengths, because they have a smaller effective capture cross-section than that of wider wells. This is particularly the case for a CdMnTe heterostructure with CdTe quantum wells.

The variations of the optical index of the zones 1 and 3 ensure the existence of a guided wave, which has been revealed by the inventors for the heterostructure of example I by the so-called "m-line" method.

A TEO (transverse-electric-optical) guided mode with an effective index of 2.84 was obtained. It is pointed out that the real optical index of CdTe is 2.955 and that of the $Cd_{1-xc}Mn_{xc}Te$ zone 4 with $x_c=0.22$ is 2.825 at the laser emission wavelength of around 770 nm.

This guided mode is defined by the index gradient in zones 1 and 3, by the step index between the heterostructure surface 12 and the environment and by the step index, when it exists, between zone 3 and the buffer layer 17. The thickness of the zones 1 and 3 are calculated so as to centre the TEO mode on zone 2.

In FIG. 5, curve B gives the intensity variations of the guided mode as a function of the heterostructure thickness p.

The optical confinement increases as the step index between the real indexes $N_c$ and $N_b$ of zones 1 and 3 increases. This imposes significant composition variations. However, due to the critical thickness, the maximum step index for a given heterostructure is limited. In exemplified manner, FIG. 2B shows the maximum step index obtainable with a CdMnTe heterostructure.

As a result of the asymmetry of the heterostructure, i.e. of zones 1 and 3, the guided mode has its maximum amplitude at the active zone thus ensuring an optimum coupling with the light gain.

The heterostructure must be formed with coherent epitaxy, i.e. below the critical thickness such that it can be modelled on the basis of experimental measurements well known to the Expert.

With the structures of examples I and II, a laser emission was obtained at ambient temperature and low temperature, both with an optical excitation with the aid of a laser and with an electronic excitation with the aid of an electron gun using a microdot electron source as described in FR-A-2 661 566.

Other constructional examples of a laser cavity according to the invention will now be described.

EXAMPLE III: GaAs/GaAlAs STRUCTURE

This structure has little lattice asymmetry or unbalance and the critical thickness problems do not occur, unlike in the case of CdMnTe structures. Moreover, it as larger optical index variations and therefore a better optical confinement that CdMnTe structures. However, this structure has a less pronounced possibility of adjusting the emission wavelength, which varies very little around 0.8 μm.

Zones 1 to 4 can be of $Ga_{1-x}Al_xAs$ with $0 \leq x \leq 1$, provided that the quantum wells of active zone 2 have an aluminium composition lower than that of zones 1 and 3 for ensuring electron confinement. Zones 1 and 3 can have thicknesses from 100 to 1000 nm and the active zone a thickness from 0.5 to 200 nm, whilst respecting the asymmetry condition $W_1 > W_3$.

In particular, a heterostructure was produced having a zone 1 350 nm thick with a composition $x_c$ on surface 12 of aluminum of 0.5 and a composition $x_b$ at the interface 22 with zone 2 of 0.20. The active zone is constituted by a 10 nm thick GaAs quantum well. The zone 3 has a composition $x_b$ of 0.20 at the interface 30 between zones 2 and 3 and a composition $x_c$ at the interface between zones 3 and 4 of 0.50, its thickness being 200 nm.

The buffer zone comprises a first buffer layer 17 of thickness 800 nm of $Ga_{1-x}Al_xAs$ with $x=x_c$ (i.e. 0.50) epitaxied on an adaptation layer constituted by a superlattice and having a thickness of 150 nm. It has in alternating from 5 GaAs quantum wells, each 10 nm thick and 5 quantum barriers of composition $x_c$ (i.e. $x_c=0.50$), each having a thickness of 10 nm. The superlattice is deposited on a 50 nm GaAs layer.

The GaAs substrate is of crystal orientation 100.

According to the invention, the GaAlAs layers and in general terms the III-V material heterostructures according to the invention are not intentionally doped.

As hereinbefore, the structure is asymmetrical and the active zone is close to the surface, thus ensuring its pumping by an external optical or electronic source having a guided mode with its maximum amplitude in the quantum well of the active zone.

EXAMPLES IV TO VI

Heterostructures based on selenide and sulphide (cf. FIG. 2A) were envisaged for emission in the blue, without doping of the material, according to the invention.

Using one or more $Cd_xZn_{1-x}Se$ wells with x between 0 and 1, it is possible to use zones 1 and 3 of variable $ZnS_ySe_{1-y}$ composition with $0 \leq y \leq 1$ (example IV).

For quantum wells in the active zone of $CdS_ySe_{1-y}$ with $0 \leq y \leq 1$, it is possible to use variable CdSSe compositions for zones 1 and 3 (example V), provided that zones 1 and 3 have a gap greater than that of the quantum well ($E_g$ increasing linearly with y).

It is also possible to produce a $Zn_zMn_{1-z}Se$ heterostructure with $0 \leq z \leq 1$ (example VI) by respecting the gap energy values of zones 1, 2 and 3 ($E_g$ increasing when the Mn composition increases). In these heterostructures, it is also necessary to take account of the critical thickness constraints, as in CdMnTe structures.

EXAMPLES VII TO IX

Quaternary II-VI semiconductor material heterostructures were also envisaged using the following materials: $Cd_xZn_zMn_{1-x-z}Te$, $Cd_xZn_{1-x}S_ySe_{1-y}$ and $Zn_zMg_{1-z}S_ySe_{1-y}$ with $0 \leq x \leq 1$, $0 \leq y \leq 1$, $0 \leq z \leq 1$ and $0 \leq x+z \leq 1$.

EXAMPLES X TO XIII

These examples relate to laser emissions in the infrared. Lasers emitting in the infrared can be produced from II-VI materials including mercury, such as $Cd_xHg_{1-x}Te$ materials with x between 0 and 1 (example X) or from IV-VI materials of type $Pb_xSn_{1-x}Te$ (example XI), $Pb_xEu_{1-x}Se$ (example XII), $Pb_xEu_{1-x}Se_yTe_{1-y}$ (example XIII) with x between 0 and 1 and y between 0 and 1 with $0 \leq x+y \leq 1$.

In CdHgTe heterostructures, more particular use is made of CdHgTe quantum wells. The critical thickness problems are of a secondary nature with these materials.

With lasers emitting in the infrared and in particular those with an emission wavelength exceeding 1 µm, it is possible to use III-V material laser diodes emitting at around 800 nm as the external pumping source.

Figure 6:
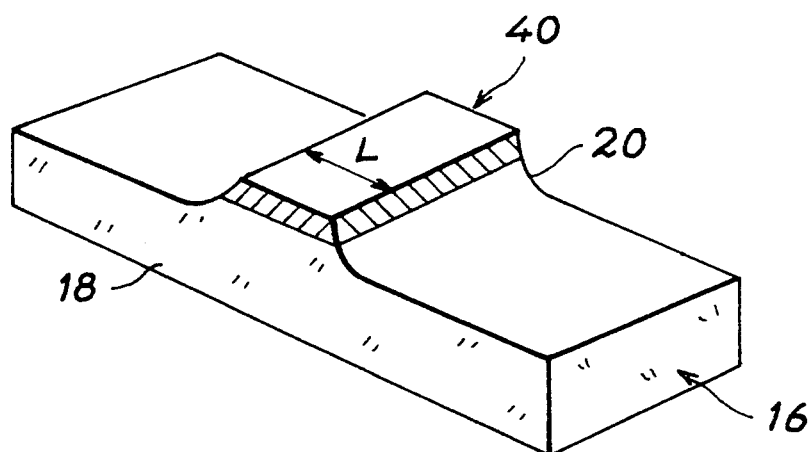

According to the invention, it is possible to consider other laser cavity types than that of FIG. 1A. In particular, the cavity according to the invention can have a mesa structure like that shown in FIG. 6. In this case, the epitaxied layers (zones 1 to 4) and optionally part of the substrate 16 are chemically dry or wet etched in order to obtain a ribbon 40 extending from the cleaved faces 18 and 20, in a direction perpendicular thereto. The width L of the ribbon can vary between 2 and 50 µm and the typical value is 5 to 10 µl m.

The etching of the epitaxied layers also permits a lateral confinement of the laser cavity excitation zone.

Figure 7:
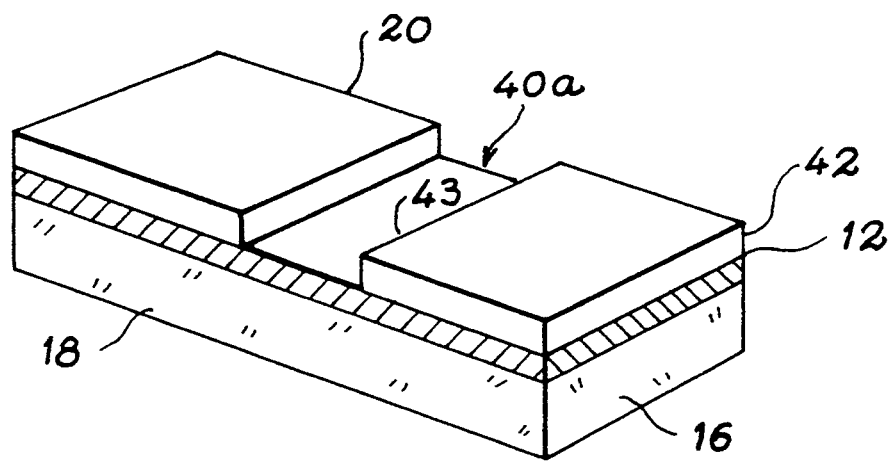
FIGS. 7 and 8 Two other variants of the laser cavity according to the invention.

The laser cavity according to the invention can also have the structure shown in FIG. 7. In this embodiment, the ribbon 40a for confining the external optical or electronic excitation is obtained by a metal deposit 42 on the surface 12 of the stack of epitaxied layers. This deposit has a ribbon-like opening 43 in its median part. The ribbon 40a is oriented perpendicular to the cleaved faces 18, 20. It characteristics are identical to those described relative to FIG. 6. The thickness of the layer 42 exceeds 20 nm. The metal used can be silver, gold or aluminium.

Apart from the lateral confinement, said etched metal deposit removes the excess energy resulting from the heat produced by the pumping beam. Moreover, it can stop electrons or photons, as a function of the pumping type used, which are emitted outside the excitation ribbon 40a.

When the deposit 42 is used for cooling or spatial filtering of the electron or photon beam, its thickness must be adequate to stop the electrons or photons and also so as to ensure a good heat conduction. In this case, the layer 42 has a thickness between 0.2 and 2 µm.

According to the invention, the laser cavity 10 is placed on a thermal mass, as shown in FIGS. 8A to 8E. This thermal mass carries the reference 44 and is made from a good heat conducting metal, particularly copper.

Figure 8A:
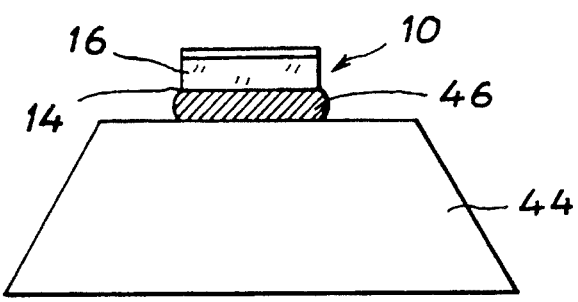

In FIG. 8A, the laser cavity 10 is fixed by its lower surface 14 to the mass 44 with the aid of a weld 46, e.g. indium or a heat and electricity conducting adhesive or glue.

The adhesion of the weld 46 to indium can be ensured by successively depositing on the lower face 14 of the laser cavity an approximately 10 to 50 nm thick chromium layer and then an approximately 50 to 200 nm gold layer, followed by an indium layer used for the weld and having a thickness of 0.05 to 2 µm. An indium deposit is also made in this way on the thermal mass 44.

After positioning the laser cavity 10 equipped with its three metal layers on the mass 44, heating takes place to between 160° and 180° C., in order to melt the indium and then cooling takes place to ambient temperature. Heating can also be used for the annealing of the heterostructure.

Figure 8B:
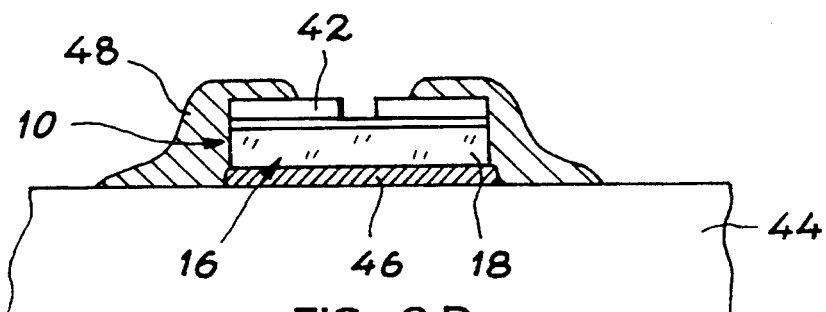

When an etched metal deposit 42 is used for the lateral confinement of the excitation, the cavity 10 can be placed on the thermal mass 44, as shown in FIG. 8B. In this case, apart from the weld 46 by the rear face 14 of the cavity, it is possible to use an indium deposit 48 on the metal confinement layer 42, as well as on the non-active side faces (i.e. perpendicular to the cleaved faces) of the laser cavity.

Figure 8C:
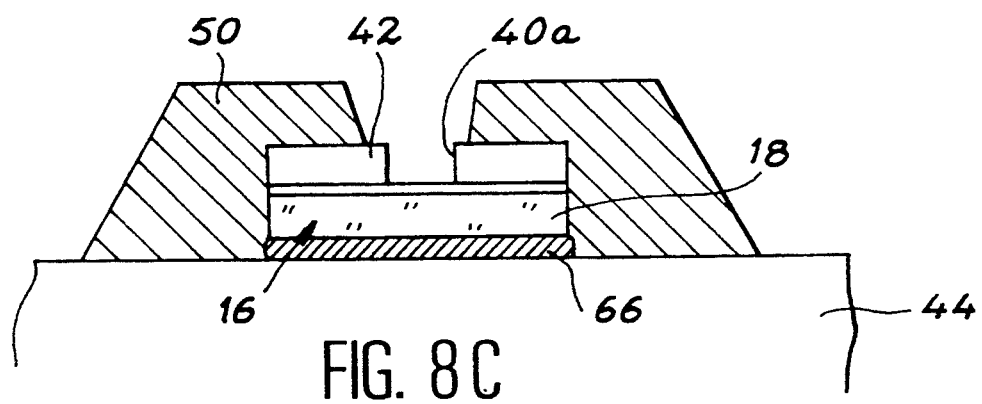

It is also possible to replace the indium surface weld 48 by metal parts 50, like those shown in FIG. 8C. These parts 50 are e.g. made from copper.

Obviously, the indium weld 48 and metal parts 50 must have an opening facing the exciting ribbon 40a.

Figure 8D:
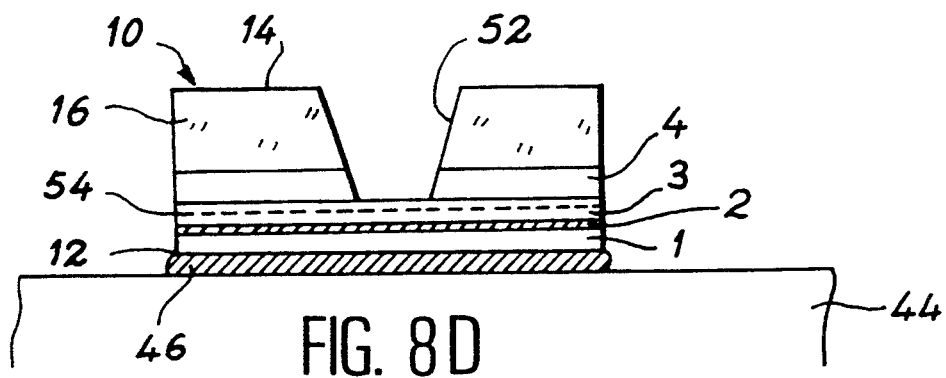
Figure 8:
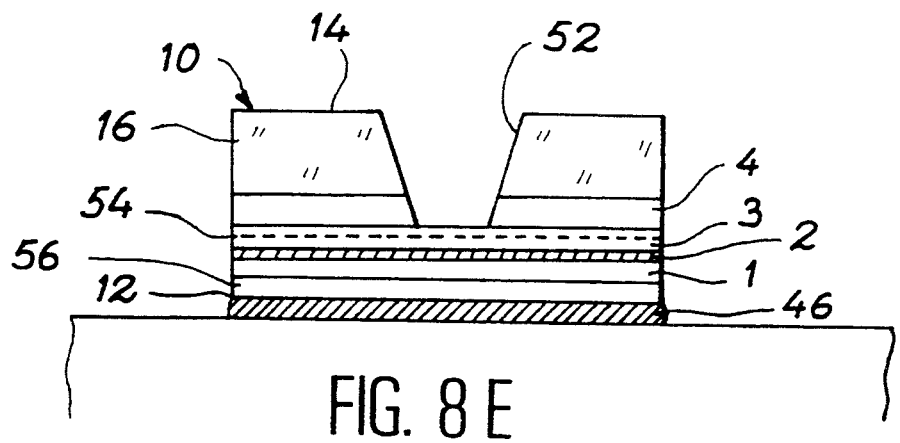

In an original installation variant shown in FIG. 8D, in order to obtain a very effective cooling of the laser cavity 10, the thermal mass 44 can be fitted in the reverse manner to what is shown in FIGS. 8A and 8C. In other words, the epitaxied layers rest on the thermal mass 44, fixing being ensured by the weld 46 bearing on the upper surface 12. With such a reversed fitting procedure, as in the variants of FIGS. 8B and 8C, it would be possible to have a not shown metal coating 48 or 50 bearing on the surface 14 and therefore on the substrate 16 of the cavity 10.

In order to ensure an optical or electronic pumping with an external source, the laser cavity according to the invention must have a clearance 52 up to the zone 3. This clearance 52 is obtained by local chemical etching of the substrate 16 and the zone 4 over the entire thickness thereof.

In this operating case, the zone 3 serves as an exciting and collecting zone. The functions of the zones 1 and 3 are reversed compared with the normal excitation case on the surface 12. In particular, the respective thicknesses $W_1$ and $W_3$ of the layers 1 and 3 must be specially designed for this reverse case with $W_3 > W_1$.

In order to facilitate the etching of zone 4, an etching stop layer 54 able to withstand the etching agents of zone 4 can be interposed between zones 3 and 4, as shown in FIG. 8D. It must therefore be made from a material different from that of zone 3.

For a CdMnTe heterostructure, the layer 54 can be of CdMnTe with a higher Mn concentration than that of the layer 4 and can have a thickness of 10 to 500 nm. For a GaAlAs heterostructure, use is made of GaAlAs with a Al concentration different from that of layer 4.

In the reverse fitting procedure, in the manner shown in FIG. 8E, it is also possible to deposit a supplementary layer 56 on zone 1, in order to move it away from the surface 12 in contact with the weld 46. This layer 56 can have the same characteristics as zone 4. In this case, the asymmetry of the structure is also reversed with $W_3 > W_1$.

The optical pumping of heterostructures of CdMnTe, GaAlAs or the quaternary alloys referred to hereinbefore, can take place with a laser emitting in the visible range (e.g. at 532 nm with a double YAG laser or with an argon laser emitting in the blue-green).

Figure 9:
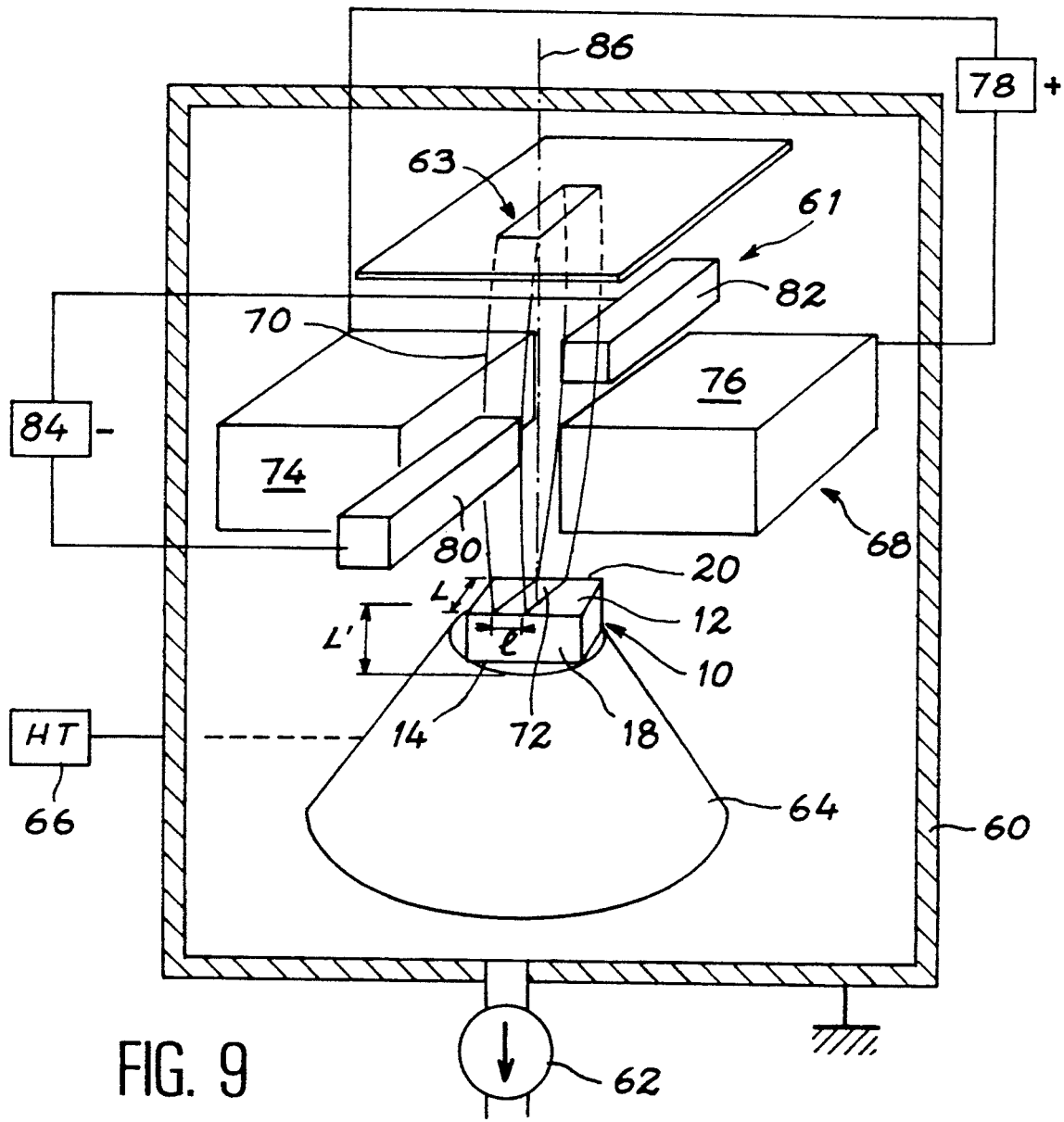
FIG. 9 Diagrammatically an embodiment of a laser according to the invention.

In the case of electronic pumping, it is possible to use a conventional electron gun or an electron gun equipped with a microdot source. An electron gun laser having a microdot source with a heterostructure according to the invention is shown in FIG. 9. This laser has a vacuum enclosure 60 equipped with a vacuum pump 62 and not shown windows for the exit of the laser emission produced by the cavity 10. The enclosure could also be vacuum sealed in order to permit autonomous operation without a vacuum pump. For example, the enclosure 6 is raised to earth potential.

The electron gun 61 for exciting the cavity 10 has a microdot cold source 63, whose precise structure is that described in FR-A-2 661 566. It is constituted by a molybdenum microdot matrix or array supported by cathode electrodes having the form of parallel strips. Grids, isolated from the cathode electrodes and also in the form of parallel strips, are positioned perpendicular to the cathode electrodes and have openings facing the microdots.

The cavity 10 is fitted on an anode 64 raised to high voltage by means of an external source 66. Between the anode 66 and the cold source 63 there is an array 68 of electrodes for focusing onto the upper surface 12 or zone 3 (FIG. 8D) of the laser cavity, the electron beam 70 emitted by the source 63.

This array 68 is arranged so that the electron beam 70 strikes the surface facing the cavity 10 in the form of a ribbon 72, whose length L' is at the least equal to the distance separating the active faces 18, 20 of the laser cavity and whose width l is between 5 and 200 $\mu$m.

This electrode array 68 is arranged so as to also serve as an electrostatic shield for the cold source against the high voltage applied to the anode 64. For this purpose, it has at least two pairs of electrodes with different dimensions, namely a first pair 74 and 76 brought to an external positive electric supply source 78 and a second pair 80, 82 connected to a negative external electric power source 84.

The electrodes 74 and 76 are arranged symmetrically with respect to the longitudinal axis 86 of the electron gun. This also applies with respect to the electrodes 80 and 82.

An operational example of the laser of FIG. 9 according to the invention will now be given. The laser cavity 10 is raised to a positive voltage of 3 to 10 kV by means of the anode 64.

The electron beam 70 produced by the source 63 and then focused by the electrode array 68 in the form of a ribbon creates in the zone 1 of cavity 10 electron-hole pairs, which are captured by the quantum well active zone. These electron-hole pairs recombine in the active zone in order to produce light, whose wavelength is dependent on the heterostructure of the laser cavity. For CdMnTe structures, emission takes place between the red and the blue-green.

For an electron-hole pair density beyond a certain threshold dependent on the heterostructure, stimulated emission takes place and an optical gain appears. The photons emitted in the active zone are confined in the laser cavity and if the optical gain is sufficiently high to compensate the losses, then laser emission takes place. The net gain necessary at the laser threshold is typically 20 to 40 cm$^{-1}$. The power density at the laser threshold is typically 1 to 20 kW/cm$^2$.

The total power "P" received by the laser cavity is much dependent on the focusing of the beam and in particular the excitation ribbon width l. For a given target of length L (Fabry-Perot cavity length) and for a useful electron density D, the power will be P=D.L.l.

For a given acceleration voltage V applied to the anode, the electron current I is defined by I=D.L.l/V.

NUMERICAL EXAMPLE

With V=10 kV, L=600 $\mu$m and D=2 kW/cm$^2$, we obtain:
for L=150 $\mu$m, P=1.8 W and I=180 $\mu$A, and
for l=10 $\mu$m, P=120 mW and I=12 $\mu$A.

These numerical values shows that a good focusing, corresponding to the minimum ribbon width l makes it possible to reduce the total power supplied by the gun and therefore simplify its cooling, accept higher laser threshold densities as a result of the fact that, for the same power, the excitation current density is increased by a good focusing of the electron beam and significantly decrease the laser operating current, so that there is less stressing of the microdot source.

The heat given off by electron bombardment is removed by the thermal mass, which can be associated with a Peltier element or a cryostat.

Figure 10:
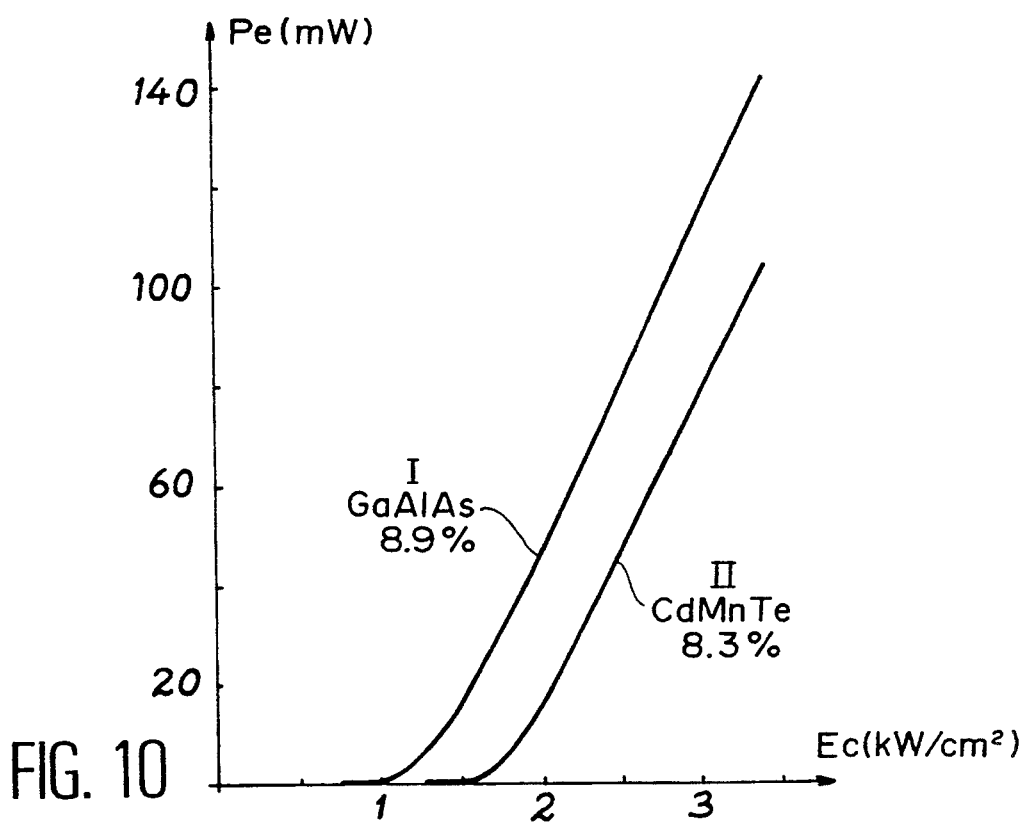
FIG. 10 Variations of the laser power ($P_1$) in mW as a function of the electronic excitation ($E_c$) of the laser in $kW/cm^2$ for a GaAlAs heterostructure and a CdMnTe heterostructure, measured in the quasi-continuous mode.

FIG. 10 shows a typical result of the operation of two Fabry-Perot laser cavities of GaAs/GaAlAs emitting at 830 nm and CdTe/CdMnTe emitting at 760 nm. FIG. 10 gives the variations of the laser power P$_1$ in mW, as a function of the electron excitation E$_c$ in kW/cm$^2$.

Curve I relates to GaAlAs and curve II to CdMnTe. The laser cavities are those of examples II and III. These laser powers were established at approximately 90K for an electron acceleration voltage of 10 kV and a 150/600 $\mu$m ribbon. The electron gun is that of FIG. 9. The emitted powers are a few hundred milliwatts with differential efficiencies of 8.9% for GaAlAs and 8.3% for CdMnTe.

The laser thresholds are respectively approximately 1 and 1.5 kW/cm$^2$. These thresholds increase by a factor of 5 to 10 at ambient temperature. For the laser of FR-A-2 661 566, the laser threshold is a few dozen kW/cm$^2$ and in the aforementioned document "Electron beam pumped II-VI lasers" by S. Colak et al, the given thresholds are a few hundred kW/cm$^2$, i.e. much higher than those of the laser according to the invention.

As the power received by the laser cavity is high (a few watts), the laser operation is quasi-continuous. Electron pulses of 5 $\mu$s spaced by 250 to 500 $\mu$s permit this quasi-continuous operation, whilst ensuring the cooling of the cavity.

Figure 11:
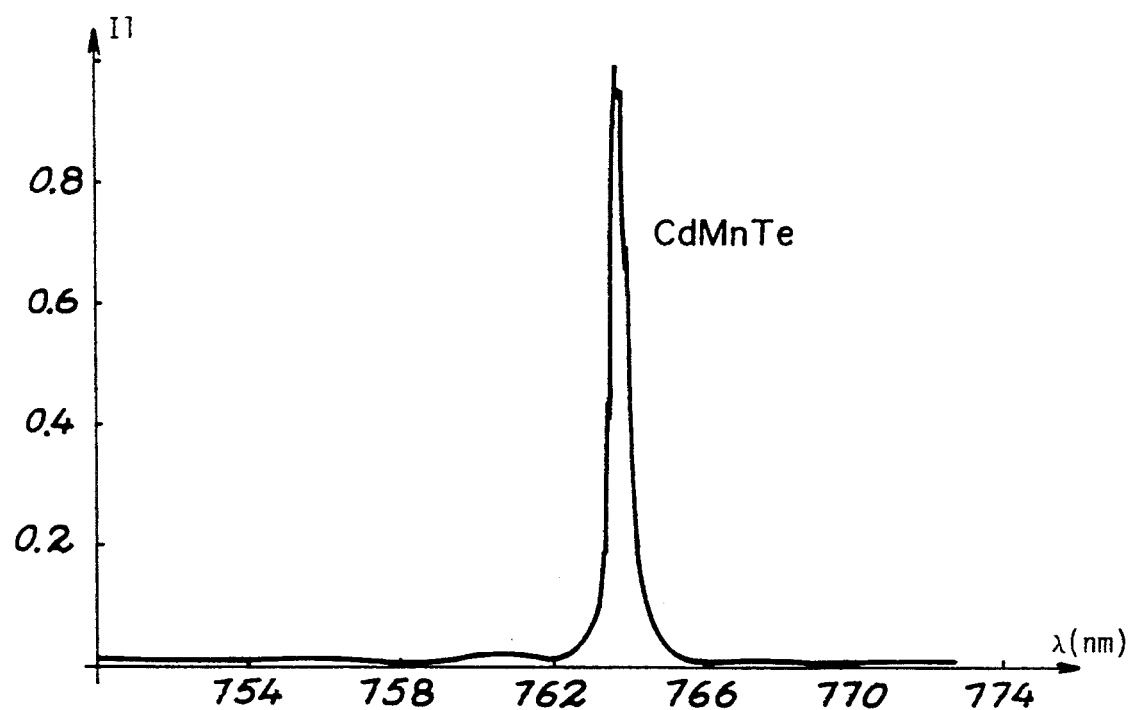
FIGS. 11A and 11B The laser emission spectrum of a CdTe/CdMnTe heterostructure of a cavity according to the invention excited by an electron beam for two different scales.
Figure 11:
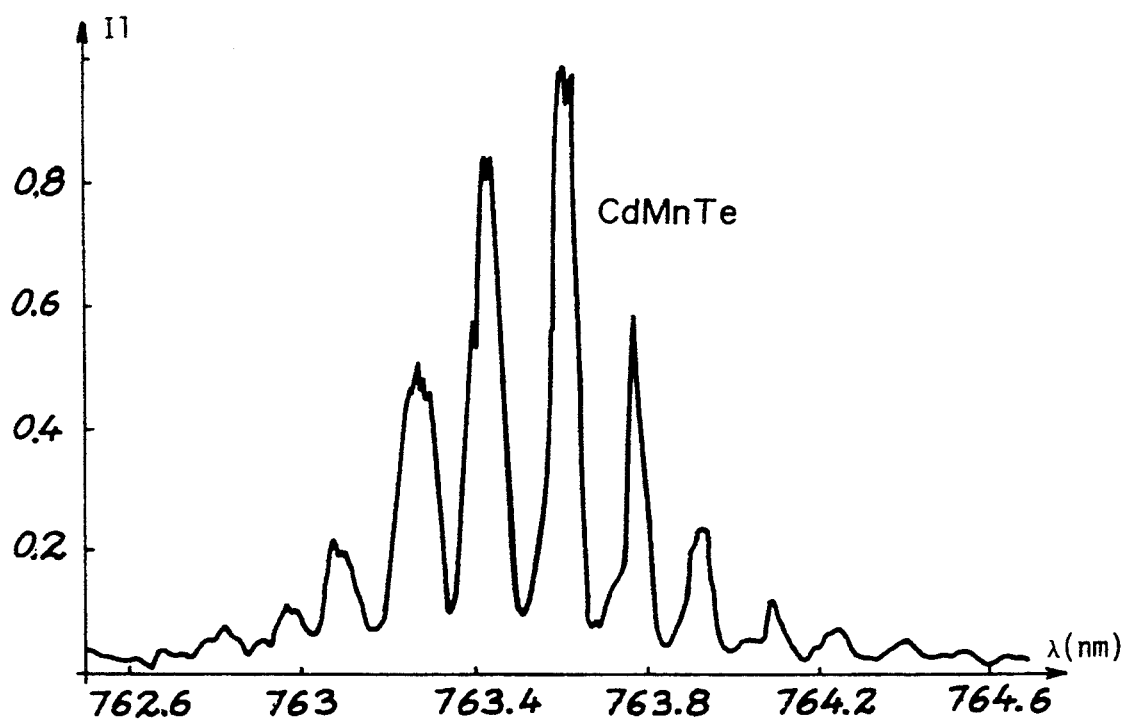

FIGS. 11A and 11B give the emission spectrum of a laser cavity according to example I. These curves give the laser intensity I$_l$in arbitrary units as a function of the wavelength $\lambda$ in nanometers. FIG. 11B is an enlargement of FIG. 11A at the emission peak.

FIG. 11A shows the refinement of the emission line and the sudden laser intensity increase as from 763 nm. FIG. 11B shows details of this emission line. These curves were plotted for a laser like that of FIG. 9 operating at 90K and using a 10 kV electron beam.

Figure 12:
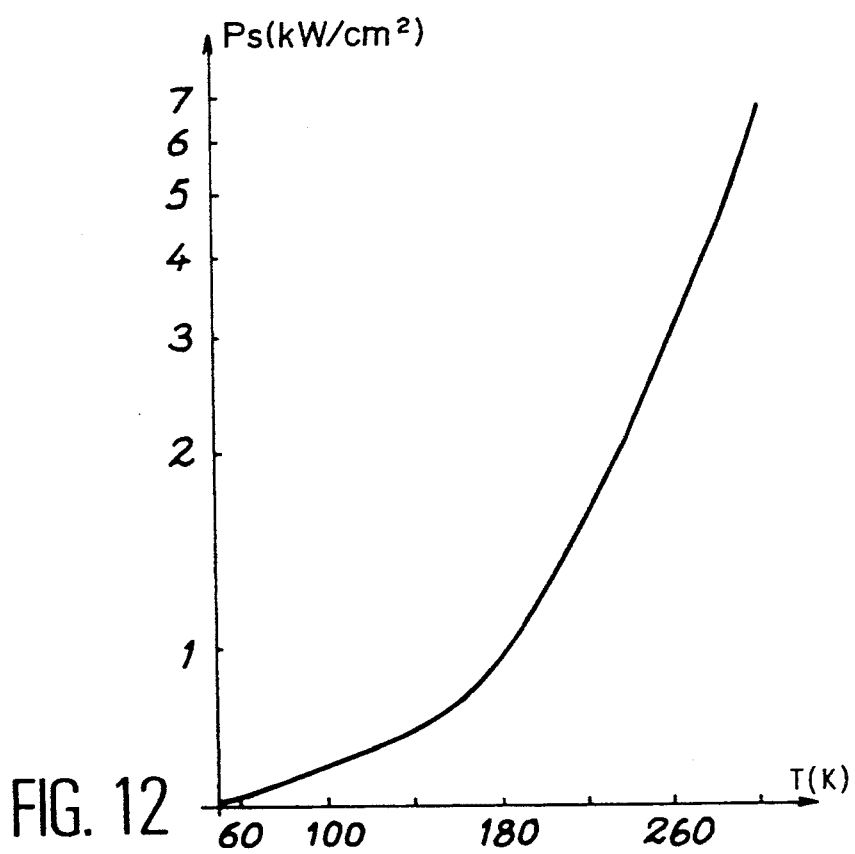
FIG. 12 The variations of the laser threshold power ($P_s$) in optical pumping, in $kW/cm^2$ (logarithmic scale) as a function of the operating temperature (T), in degrees K for a CdTe/CdMnTe heterostructure laser according to the invention.

Identical results were obtained for optical pumping on a CdMnTe laser cavity. The results are given in FIG. 12. It gives the variations of the threshold power P$_s$ in kW/cm$^2$ as a function of the laser operating temperature T in degrees K. The exciting wavelength is in this case 532 nm.

We claim:

1. Semiconductor heterostructure laser cavity having semiconductor layers epitaxied to define four zones on a substrate, said laser cavity comprising:
   a first zone with a composition that varies continuously from a first face a second face with a gap decreasing from the first face to the second face, said first zone ensuring an optical confinement and light guidance;
   a second zone constituting an active emission zone in contact with the second face of the first zone and having at least one quantum well with a gap smaller than that of the first zone;
   a third zone having a gap larger than that of the at least one quantum well, said third zone ensuring an optical confinement and a light guidance, and having a composition which varies continuously from a first face to a second face with a gap which increases from the first face to the second face, the first face of the third zone being in contact with the active emission zone; and
   a fourth zone constituting a buffer zone which contacts the second face of the third zone and the substrate, said fourth zone serving as an optical barrier for light guiding, the first and third zones being asymmetrical with respect to the active emission zone to define an asymmetrical GRINSCH structure, one of the first and third zones constituting a surface of the semiconductor heterostructure and ensuring an electron excitation and creation of electron-hole pairs.

2. Laser cavity according to claim 1, wherein the fourth zone includes:
   a buffer layer serving as an optical barrier in contact with the second zone; and
   an adapting layer in contact with the substrate.

3. Laser cavity according to claim 1, wherein the fourth zone has a superlattice structure incorporating an alternation of quantum wells and quantum barriers.

4. Laser cavity according to claim 1, wherein the first zone has a thickness greater than that of the third zone.

5. Laser cavity according to claim 1, wherein the first zone has a thickness not greater than 1 $\mu$m.

6. Laser cavity according to claim 1, wherein the composition of the first zone at the first face is identical to the composition of the third zone at its second face, and wherein the composition of the first zone at its second face is identical to the composition of the third zone at its first face.

7. Laser cavity according to claim 6, wherein the active emission zone has at least one quantum barrier with an identical composition to that of the first zone at its second face.

8. Laser cavity according to claim 1, wherein the semiconductor heterostructure further includes:
   means for ensuring a ribbon lateral confinement of the electron excitation.

9. Laser cavity according to claim 1, wherein the first face of the first zone further includes:
   a metal deposit having a ribbon-shaped opening in a median portion constituting lateral confinement means of the electron excitation.

10. Laser cavity according to claim 1, wherein the laser cavity further includes:
    two parallel, cleaved side faces constituting semireflecting mirrors.

11. Laser cavity according to claim 1, wherein the semiconductor heterostructure is made from at least one semiconductor material chosen from the group consisting of: $Cd_{1-x}Mn_xTe$, $Cd_xHg_{1-x}Te$, $Cd_xZn_{1-x}Te$, $Cd_xZn_zMn_{1-x-z}Te$, $Cd_xZn_{1-x}Se$, $ZnS_ySe_{1-y}$, $CdS_ySE_{1-y}$, $Cd_xZn_{1-x}S_ySe_{1-y}$, $Zn_zMn_{1-z}Se$, $Zn_zMg_{1-z}S_ySe_{1-y}$, $Ga_xAl_{1-x}As$, $Ga_xAl_{1-x}N$, $Pb_xSn_{1-x}Te$, $Pb_xEu_{1-x}Se$, $Pb_xEu_{1-x}Se_yTe_{1-y}$ with $0 \leq x \leq 1$, $0 \leq y \leq 1$, $0 \leq z \leq 1$ and $0 \leq x+z \leq 1$.

12. Laser cavity according to claim 1, wherein the semiconductor heterostructure includes:
    semiconductor layers interdiffused by a heat treatment at 150° to 400° C.

13. Semiconductor laser having a laser cavity and cavity pumping means, the laser cavity having semiconductor layers epitaxied to define four zones on a substrate, said laser cavity comprising:
    a first zone with a composition that varies continuously from a first face to a second face with a gap decreasing from the first face to the second face, said first zone ensuring an optical confinement and light guidance;
    a second zone constituting an active emission zone in contact with the second face of the first zone and having at least one quantum well with a gap smaller than that of the first zone;
    a third zone having a gap larger than that of the at least one quantum well, said third zone ensuring an optical confinement and a light guidance, and having a composition which varies continuously from a first face to a second face with a gap which increases from the first face to the second face, the first face of the third zone being in contact with the active emission zone; and
    a fourth zone constituting a buffer zone which contacts the second face of the third zone and said substrate, said fourth zone serving as an optical barrier for light guiding, the first and third zones being asymmetrical with respect to the active emission zone to define an asymmetrical GRINSCH structure, one of the first and third zones constituting a surface of the semiconductor heterostructure and ensuring an electron excitation and creation of electron-hole pairs.

14. Laser according to claim 13, wherein the cavity pumping means is an electron gun.

15. Laser according to claim 14, wherein the electron gun further includes:
    a microdot cold source for emitting an electron beam;
    a high voltage anode for accelerating the electrons; and
    an electrode array for ribbon focusing of the electron beam on the laser cavity.

16. Laser according to claim 13, wherein the laser cavity is mounted on a thermal mass for ensuring temperature control of the laser cavity.

17. Laser according to claim 13, wherein the laser cavity is mounted on a thermal mass with the epitaxied layers resting on said mass, a local freeing of the substrate and the buffer zone being provided to ensure pumping at the third zone.

18. Laser according to claim 17, wherein the laser cavity is fixed by welding or bonding to the thermal mass.

19. Laser according to claim 18, wherein the laser cavity has a surface layer moving the first zone away from the weld or bond on the thermal mass.

20. Laser according to claim 17, wherein the laser cavity further includes:
    an etching stop layer made from a semiconductor material between the buffer zone and the third zone.

* * * * *